(12) United States Patent  
Kaneko et al.

(10) Patent No.: US 8,039,333 B2
(45) Date of Patent: Oct. 18, 2011

(54) SEMICONDUCTOR DEVICE AND METHOD OF FABRICATING THE SAME

(75) Inventors: Akio Kaneko, Fishkill, NY (US); Seiji Inumiya, Kanagawa (JP); Tomonori Aoyama, Kanagawa (JP); Takuya Kobayashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 35 days.

(21) Appl. No.: 12/359,974

(22) Filed: Jan. 26, 2009

(65) Prior Publication Data

US 2009/0194821 A1 Aug. 6, 2009

(30) Foreign Application Priority Data

Jan. 31, 2008 (JP) ................. 2008-021948

(51) Int. Cl.
*H01L 21/336* (2006.01)
*H01L 21/8234* (2006.01)

(52) U.S. Cl. ........ 438/198; 438/197; 438/482; 438/486; 438/788; 257/E21.297; 257/E21.412; 257/E21.379; 257/E29.003

(58) Field of Classification Search .................. 438/482, 438/486, 197, 198, 788; 257/E21.297, E21.412, 257/E21.379, E29.003
See application file for complete search history.

(56) References Cited

U.S. PATENT DOCUMENTS

| 6,255,149 B1 * | 7/2001 | Bensahel et al. ............. 438/172 |
| 6,346,732 B1 | 2/2002 | Mizushima et al. |
| 6,406,973 B1 | 6/2002 | Lee |
| 7,202,513 B1 * | 4/2007 | Chidambarrao et al. ..... 257/190 |
| 7,220,626 B2 * | 5/2007 | Zhu et al. ...................... 438/154 |

FOREIGN PATENT DOCUMENTS

| JP | 5-183154 | 7/1993 |
| JP | 2001-189451 | 7/2001 |

* cited by examiner

*Primary Examiner* — Michelle Estrada
(74) *Attorney, Agent, or Firm* — Finnegan, Henderson, Farabow, Garrett & Dunner, L.L.P.

(57) ABSTRACT

A method of fabricating a semiconductor device according to one embodiment includes: forming a SiGe crystal layer on a semiconductor substrate, the SiGe crystal layer having a first plane and a second plane inclined with respect to the first plane; forming an amorphous Si film on the SiGe crystal layer; crystallizing a portion located adjacent to the first and second planes of the amorphous Si film by applying heat treatment using the first and second planes of the SiGe crystal layer as a seed, thereby forming a Si crystal layer; selectively removing or thinning a portion of the amorphous Si film that is not crystallized by the heat treatment; applying oxidation treatment to a surface of the Si crystal layer, thereby forming a gate insulating film on the surface of the Si crystal layer; and forming a gate electrode on the gate insulating film.

12 Claims, 11 Drawing Sheets

US 8,039,333 B2

SEMICONDUCTOR DEVICE AND METHOD OF FABRICATING THE SAME

CROSS-REFERENCE TO RELATED APPLICATIONS

This application is based upon and claims the benefit of priority from prior Japanese Patent Application No. 2008-021948, filed on Jan. 31, 2008, the entire contents of which are incorporated herein by reference.

BACKGROUND

A conventional p-type transistor is known in which current drive power is improved by using a SiGe crystal layer for a channel region. The conventional p-type transistor, for example, disclosed in JP-A-5-183154. When the SiGe crystal layer is used for the channel region, there is a case that another layer such as a Si crystal layer, etc., is formed between a gate insulating film and the SiGe crystal layer. One of the reasons is to suppress reliability degradation of the gate insulating film. This is because Ge in the SiGe crystal layer may diffuse into the gate insulating film when the gate insulating film is formed by applying oxidation treatment to a surface of the SiGe crystal layer, which may result the reliability degradation of the gate insulating film.

However, in a conventional transistor using a SiGe crystal layer for a channel region, since both of a SiGe crystal layer and a Si crystal layer, which is an upper layer thereof, are generally formed by using a vapor-phase epitaxial crystal growth method, the following problem may occur.

When the SiGe crystal is epitaxially grown, surfaces having different plane directions such as, e.g., a (100) plane and a (111) plane, appears. And then, when Si crystal is grown by vapor-phase epitaxy on the SiGe crystal layer, since a growth rate is different depending on a plane direction of a surface which is a base (seed) of the growth, a thickness of the crystal varies depending on portions. For example, since the growth rate of the Si crystal on the (111) plane of the SiGe crystal layer is slower than that of the Si crystal on the (100) plane, the thickness of a portion located on the (111) plane is smaller than that of a portion located on the (100) plane in the Si crystal layer.

Therefore, in the portion where the Si crystal layer is thin, a distance between the gate insulating film and the SiGe crystal layer is narrowed, which results in that Ge becomes likely to diffuse into the gate insulating film. On the other hand, if a thick Si crystal layer is formed in order to avoid such a problem, since a thickness of a portion originally having an enough thickness is further increased, a region of the SiGe crystal layer functioning as a channel region is decreased, thereby reducing an effect of improving the current drive power.

BRIEF SUMMARY

A method of fabricating a semiconductor device according to one embodiment includes: forming a SiGe crystal layer on a semiconductor substrate, the SiGe crystal layer having a first plane and a second plane inclined with respect to the first plane; forming an amorphous Si film on the SiGe crystal layer; crystallizing a portion located adjacent to the first and second planes of the amorphous Si film by applying heat treatment using the first and second planes of the SiGe crystal layer as a seed, thereby forming a Si crystal layer; selectively removing or thinning a portion of the amorphous Si film that is not crystallized by the heat treatment; applying oxidation treatment to a surface of the Si crystal layer, thereby forming a gate insulating film on the surface of the Si crystal layer; and forming a gate electrode on the gate insulating film.

A method of fabricating a semiconductor device according to another embodiment includes: forming a SiGe crystal layer on a semiconductor substrate, the SiGe crystal layer having a first plane and a second plane inclined with respect to the first plane; forming an amorphous Si film on the SiGe crystal layer; forming a gate insulating film by applying oxidation treatment to a surface of the amorphous Si film; and forming a gate electrode on the gate insulating film.

A semiconductor device according to another embodiment includes: a semiconductor substrate; a SiGe crystal layer formed on the semiconductor substrate and having a first plane and a second plane inclined with respect to the first plane; a Si crystal layer formed on the SiGe crystal layer, a thickness of a portion located on the first plane being substantially same as that of a portion located on the second plane in the Si crystal layer; a gate insulating film formed on the Si crystal layer and containing Si and O; and a gate electrode formed on the gate insulating film.

DETAILED DESCRIPTION

First Embodiment (Structure of Semiconductor Device)

Figure 1:
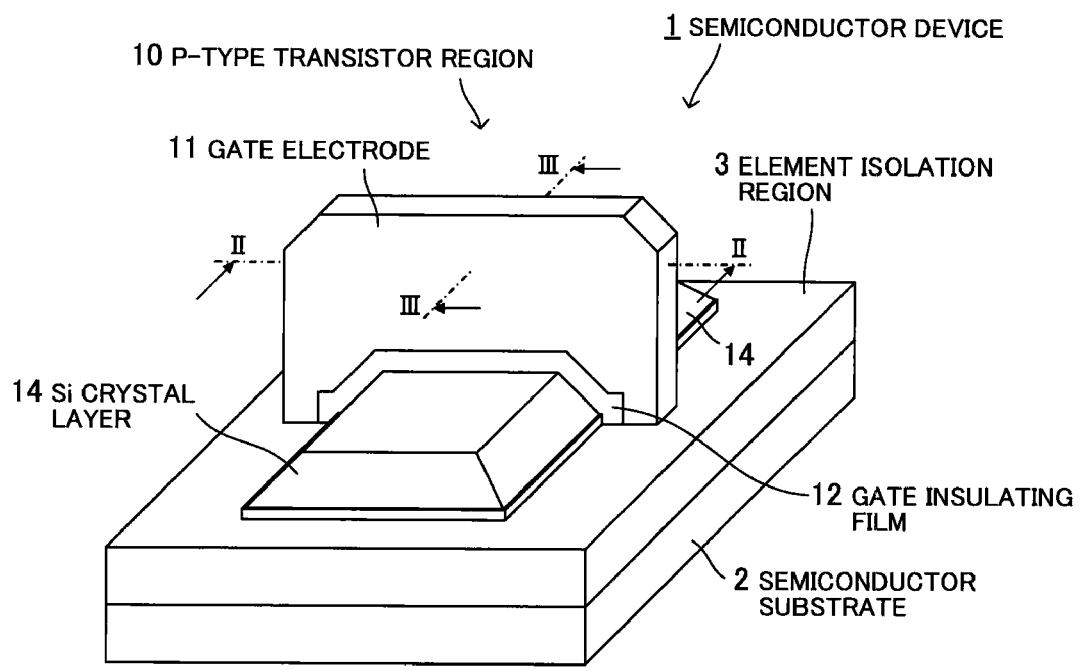
FIG. 1 is a bird's-eye view showing a semiconductor device according to a first embodiment.
Figure 2:
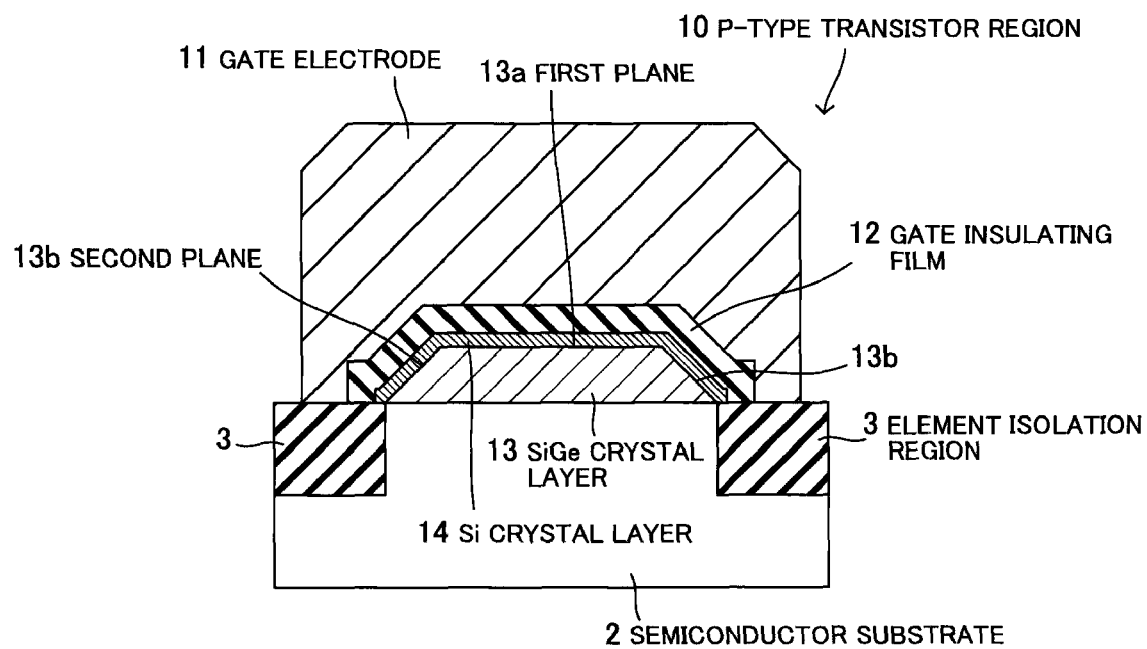
FIG. 2 is a cross sectional view when a cut surface taken on chain line II-II of FIG. 1 is viewed in a direction indicated by an arrow in the figure.
Figure 3A:
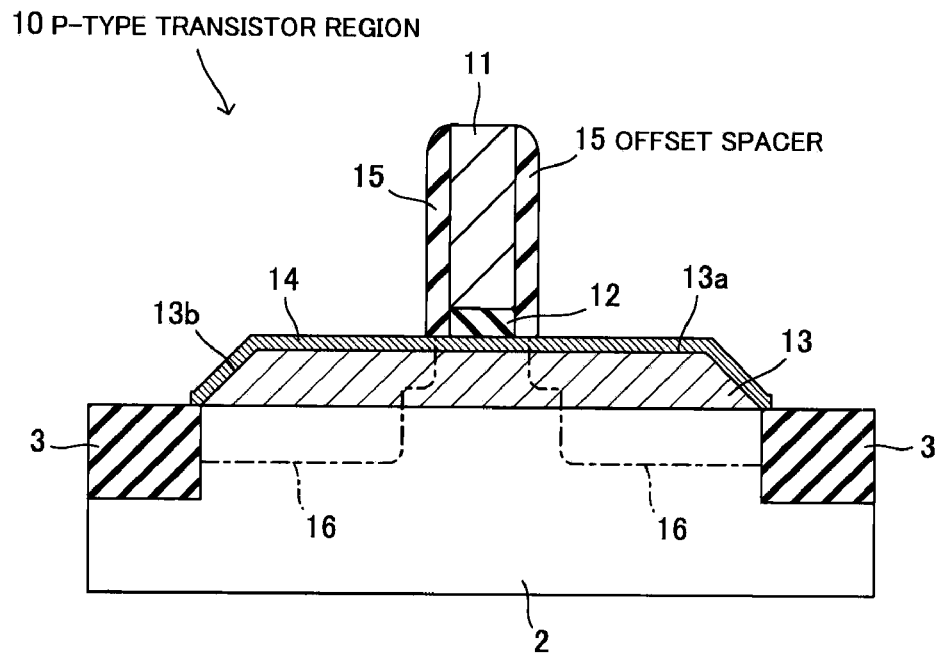
FIGS. 3A and 3B are cross sectional views when a cut surface taken on chain line III-III of FIG. 1 is viewed in a direction indicated by an arrow in the figure.
Figure 3B:
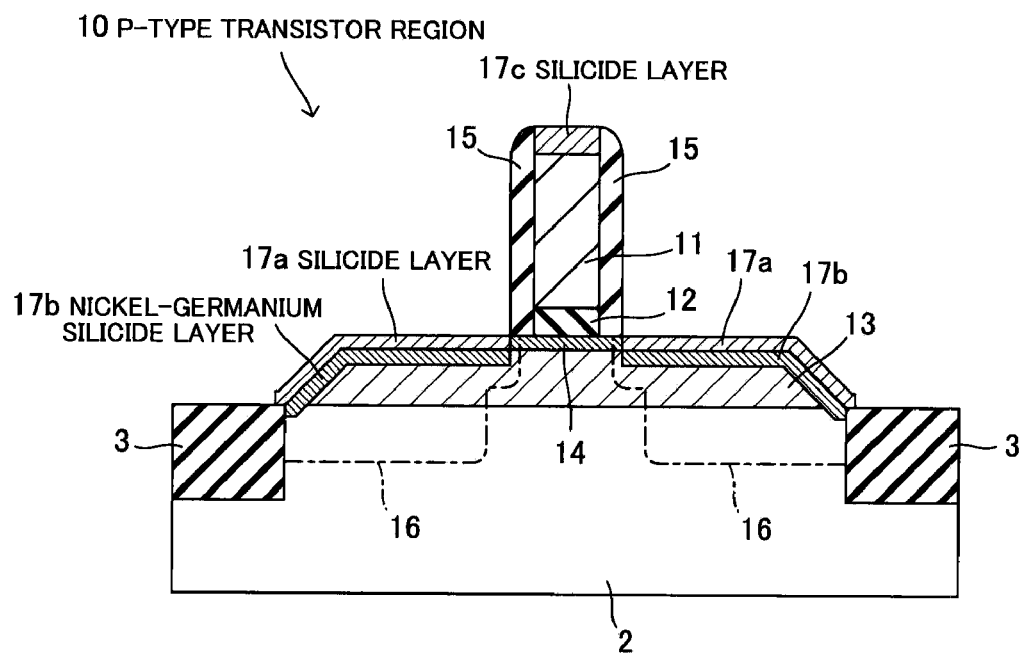

FIG. 1 is a bird's-eye view showing a semiconductor device according to a first embodiment. FIG. 2 is a cross sectional view when a cut surface taken on chain line II-II of FIG. 1 is viewed in a direction indicated by an arrow in the figure. FIGS. 3A and 3B are cross sectional views when a cut surface taken on chain line III-III of FIG. 1 is viewed in a direction indicated by an arrow in the figure.

A semiconductor device 1 has a p-type transistor region 10 including a SiGe crystal layer 13 formed on a semiconductor substrate 2, a Si crystal layer 14 formed on the SiGe crystal layer 13, a gate electrode 11 formed on the Si crystal layer 14 via a gate insulating film 12, an offset spacer 15 formed on side faces of the gate electrode 11 and the gate insulating film 12, and source/drain regions 16 formed in the Si crystal layer 14, the SiGe crystal layer 13 and the semiconductor substrate 2 on both sides of a portion under the gate electrode 11. In addition, in the semiconductor device 1, the p-type transistor region 10 is electrically separated from other element regions by element isolation regions 3 formed in the semiconductor substrate 2. Note that, illustrations of the offset spacer 15 and the source/drain regions 16 are omitted in FIG. 1.

The semiconductor substrate 2 is, e.g., a Si substrate in which a plane direction of the principal surface thereof is a (100) plane.

The gate electrode 11 is made of, e.g., polycrystalline Si or polycrystalline SiGe, each containing a conductivity type impurity. A p-type impurity such as B or $BF_2$, etc., is used for the conductivity type impurity. Alternatively, the gate electrode 11 may be a metal gate electrode made of W, Ta, Ti, Hf, Zr, Ru, Pt, Ir, Mo, Al, La, Y, Mg or Er, etc., or a compound thereof. Furthermore, the gate electrode 11 may have a structure in which a metal gate electrode and a polycrystalline Si-based electrode are laminated. Furthermore, when an upper portion of the gate electrode 11 is made of a Si based crystal, a silicide layer 17c may be formed on an upper surface of the gate electrode 11 as shown in FIG. 3B.

The SiGe crystal layer 13 is made of a SiGe crystal formed by an epitaxial crystal growth method using an upper surface of the semiconductor substrate 2 as a seed, and has a first plane 13a parallel to the upper surface of the semiconductor substrate 2 and a second plane 13b inclined with respect to the first plane 13a. Here, for example, when the principal surface of the semiconductor substrate 2 is a (100) plane, the first plane 13a is the (100) plane and the second plane 13b is a (111) plane. In addition, a region of the SiGe crystal layer 13 under the gate electrode 11 (a region sandwiched by the source/drain regions 16) functions as a channel region.

Alternatively, a layer made of a SiC crystal or SiGeC crystal, etc., which contains an element having a property to decrease reliability of the gate insulating film 12 when being included in the gate insulating film 12 and has a plane parallel to the upper surface of the semiconductor substrate 2 and another plane inclined with respect to the plane, may be used instead of the SiGe crystal layer 13.

The Si crystal layer 14 is made of a Si crystal formed by a solid-phase epitaxial crystal growth method using an upper surface of the SiGe crystal layer 13 as a seed. In the Si crystal layer 14, a thickness of a portion located on the first plane 13a is substantially same as that of a portion located on the second plane 13b. Note that, Ge diffused from inside of the SiGe crystal layer 13 may be contained in the Si crystal layer 14.

In addition, as shown in FIG. 3B, a silicide layer 17a made of metal silicide such as Ni silicide, etc., may be formed on a portion of the Si crystal layer 14 located both sides of the gate electrode 11. In the present embodiment, since a portion of the Si crystal layer 14 located on the second plane 13b has a thickness substantially equal to that of a portion located on the first plane 13a and has a certain thickness, it is possible to suppress an increase in volume of a nickel-germanium silicide layer 17b formed by a silicide reaction extending to the SiGe crystal layer 13 at the time of reacting a Ni metal layer formed on the upper surface of the Si crystal layer 14 with the Si crystal layer 14 for forming the silicide layer 17a. Since the nickel-germanium silicide layer 17b may contain a phase such as NiGe, etc., less stable than the silicide layer 17a such as NiSi, etc., it is possible to obtain an effect of suppressing generation of junction leakage by suppressing the increase in the volume of the nickel-germanium silicide layer 17b. Furthermore, although there is concern of a phenomenon in which the silicide is formed thick in the proximity of an interface between the semiconductor substrate 2 and the element isolation region 3 by an unreacted metal such as Ni, etc., entered into the SiGe crystal layer 13 as well as the Si crystal layer 14 and the junction leakage is thereby increased, it is possible to suppress this phenomenon since the unreacted metal is left at a position on the element isolation region 3 distant from the interface between the semiconductor substrate 2 and the element isolation region 3.

The gate insulating film 12 is an insulating film formed by oxidizing a surface of a Si crystal formed by the solid-phase epitaxial crystal growth method using the upper surface of the SiGe crystal layer 13 as a seed, and is made of an insulating material containing Si and O such as $SiO_2$ or SiON, etc. Here, since oxidation reaction at the time of forming the gate insulating film 12 does not extends to the SiGe crystal layer 13, Ge in the SiGe crystal layer 13 is not introduced into the gate insulating film 12 at this time. Therefore, although Ge diffused from the inside of the SiGe crystal layer 13 may be slightly mixed into the gate insulating film 12 via the Si crystal layer 14 during a heat treatment process, Ge is not substantially contained in the gate insulating film 12.

The element isolation region 3 is made of, e.g., an insulating material such as $SiO_2$, etc., and has a STI (Shallow Trench Isolation) structure. Vertical position of the upper surface of the element isolation region 3 may be different from that of the semiconductor substrate 2.

The offset spacer 15 is made of, e.g., an insulating material such as $SiO_2$ or SiN, etc. In addition, although it is not shown in the figures, a gate sidewall made of an insulating material is formed on the side face of the offset spacer 15.

The source/drain region 16 is formed by implanting a p-type impurity such as B or $BF_2$, etc., into the Si crystal layer 14, the SiGe crystal layer 13 and the semiconductor substrate 2 by an ion implantation procedure, etc.

An example of the processes for fabricating the semiconductor device 1 according to the present embodiment will be described hereinafter.
(Fabrication of Semiconductor Device)

FIGS. 4A to 4F are cross sectional views showing processes for fabricating the semiconductor device according to the first embodiment.

Figure 4A:
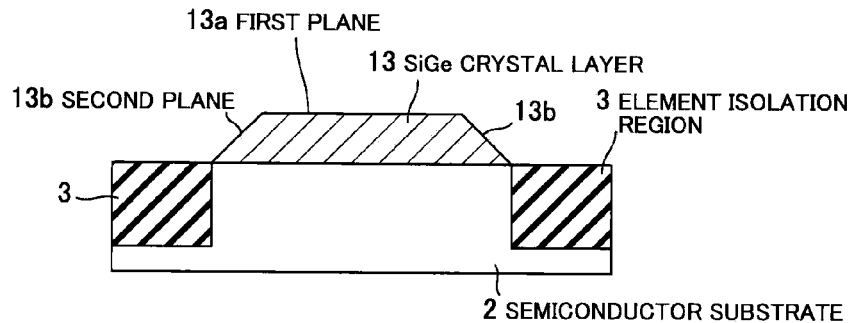
FIGS. 4A to 4F are cross sectional views showing processes for fabricating the semiconductor device according to the first embodiment.

Firstly, as shown in FIG. 4A, the element isolation regions 3 are formed in the semiconductor substrate 2, SiGe crystal is sequentially epitaxially grown using an upper surface of the semiconductor substrate 2 as a seed, thereby forming the SiGe crystal layer 13.

Here, the SiGe crystal layer 13 is formed by, e.g., a CVD (Chemical Vapor Deposition) method using DCS ($SiH_2Cl_2$) gas, $GeH_4$ gas or HCl gas so as to be 30 at. % of the Ge concentration and 20 nm in thickness, and then, the first plane 13a and the second plane 13b appear. Note that, $H_2$ gas or $N_2$ gas may be added when forming the SiGe crystal layer 13 by the CVD method.

In addition, an effect such as reduction in parasitic capacity of an inversion layer or improvement in electrical charge mobility, etc., is obtained more significantly as increasing the Ge concentration of the SiGe crystal layer 13, however, the Ge concentration is preferably about 67 at. % or less from the viewpoint of thermal stability and chemical resistance in subsequent processes. Furthermore, it is more preferable that Ge concentration is about 3-33 at. % in order to suppress generation of a lattice defect which causes the generation of a leak current.

Meanwhile, the effect such as reduction in parasitic capacity of an inversion layer or improvement in electrical charge mobility, etc., is obtained more significantly as increasing the thickness of the SiGe crystal layer 13, however, the thickness of the SiGe crystal layer 13 is preferably 100 nm or less, e.g., about 5-30 nm, in order to suppress the generation of a lattice defect.

Figure 4B:
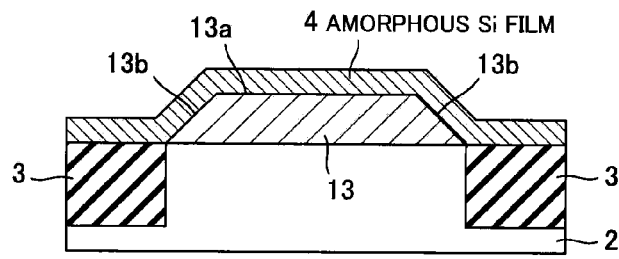

Next, as shown in FIG. 4B, an amorphous Si film 4 is formed on the SiGe crystal layer 13. Here, the amorphous Si film 4 is formed by, e.g., the CVD method using $SiH_4$ gas so that the thickness of a portion located on the first plane 13a is substantially same as that of a portion located on the second plane 13b. Note that, $H_2$ gas or $N_2$ gas may be added when forming the amorphous Si film 4 by the CVD method. In addition, at the time of the film formation, a temperature condition is, e.g., 500-600° C. and a pressure condition is, e.g., 1-700 Torr.

The amorphous Si film 4 becomes the Si crystal layer 14 in a posterior process due to crystallization of a portion located on the SiGe crystal layer 13 and the oxidation treatment is applied to the surface thereof for forming the gate insulating film 12. The thickness of the amorphous Si film 4 is defined to be larger than a progressing depth of an oxidation reaction so that the oxidation reaction does not extend to the SiGe crystal layer 13 at this time. For example, when forming an about 5 nm thick gate insulating film 12, the oxidation reaction extends to the depth of about 2.3 nm from the surface of the Si crystal layer 14.

On the other hand, when the thickness of the amorphous Si film 4 is excessively increased, since the thickness of the Si crystal layer 14 after forming the gate insulating film 12 is increased and a region of the SiGe crystal layer 13 used for an channel region is decreased, an effect such as decrease of the threshold voltage becomes poor. In this regards, however, when the thickness of the Si crystal layer 14 after forming the SiGe crystal layer 13 is about 5 nm or less, it is possible to use the Si crystal layer 14 as a portion of the SiGe crystal layer 13 by diffusing Ge in the SiGe crystal layer 13 into the Si crystal layer 14 by heat treatment.

From the above-mentioned reason, when the gate insulating film 12 is formed, e.g., about 5 nm in thickness, the thickness of the amorphous Si film 4 is preferably about 2.3-8 nm, more preferably, about 5 nm.

Figure 4C:
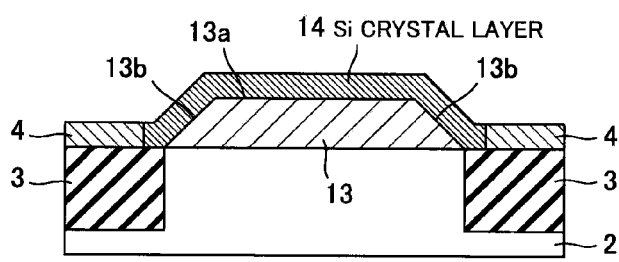

Next, as shown in FIG. 4C, the amorphous Si film 4 is crystallized by the solid-phase epitaxial crystal growth method using the first plane 13a and the second plane 13b of the SiGe crystal layer 13 as a seed, thereby forming the Si crystal layer 14. Here, since the crystallization is carried out using the first plane 13a and the second plane 13b of the SiGe crystal layer 13 as a seed, only a portion located adjacent to the interface between the amorphous Si film 4 and the SiGe crystal layer 13 becomes the Si crystal layer 14 and other portions (portions on the element isolation regions 3 in the figure) remain amorphous.

The Si crystal layer 14 is formed by, e.g., annealing in a $N_2$ or $H_2$ atmosphere at 550-620° C. At this time, it is possible to set an annealing temperature higher by implanting an impurity such as As or B, etc., into only a portion of the amorphous Si film 4 on the element isolation region 3 so as to make the portion less likely to crystallize. Note that, by annealing at 550-600° C., a process for forming the amorphous Si film 4 shown in FIG. 4B and a process for forming the Si crystal layer 14 shown in FIG. 4C can be continuously conducted in one process.

Figure 4D:
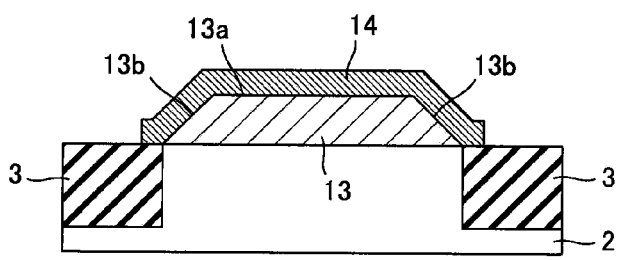

Next, as shown in FIG. 4D, the amorphous Si film 4 is selectively removed by etching using the HCl gas, etc. Consequently, only a portion of the amorphous Si film 4 that becomes the Si crystal layer 14 by the crystallization is left. Note that, $H_2$ gas or $N_2$ gas may be added when removing the amorphous Si film 4. At this time, the temperature condition is, e.g., 500-620° C. and the pressure is, e.g., 1-700 Torr.

Alternatively, the amorphous Si film 4 may be selectively removed by utilizing a wet etching using a solution containing $NH_4OH$, KOH, HF or $HNO_3$, etc.

Note that, the amorphous Si film 4 may not be completely removed, and may be left as long as having a thickness to be completely oxidized in a posterior process for forming the gate insulating film 12. This is because a significant problem does not occur in an operation of a transistor as long as the amorphous Si film 4 becomes an insulating material even if remaining in the p-type transistor region 10 without being removed. For example, when the about 5 nm thick gate insulating film 12 is formed, since the oxidation reaction progresses to the depth of about 2.3 nm from the surfaces of the Si crystal layer 14 and the amorphous Si film 4, the amorphous Si film 4 of about 2.3 nm or less in thickness may be left.

In addition, it is preferable to conduct the processes from the formation of the SiGe crystal layer 13 shown in FIG. 4A until the removal of the amorphous Si film 4 shown in FIG. 4D in the same chamber.

Figure 4E:
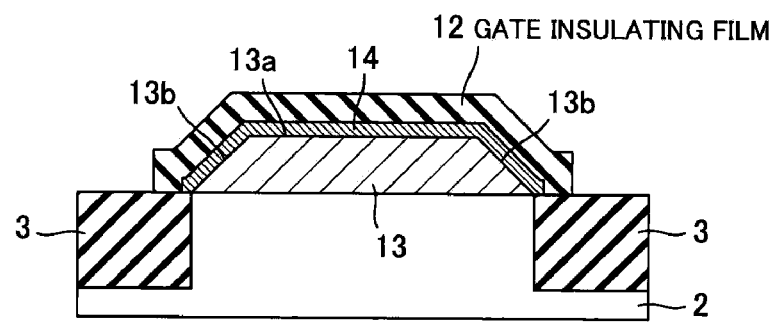

Next, as shown in FIG. 4E, the surface of the Si crystal layer 14 is oxidized by annealing in an atmosphere containing $O_2$, thereby forming the gate insulating film 12. The thickness of the gate insulating film 12 is preferably about 5 nm. Note that, $H_2$ gas, HCl gas, $N_2$ gas or $H_2O$ gas may be contained in the atmosphere at the time of annealing. Alternatively, the gate insulating film 12 may be formed by plasma oxidizing the surface of the Si crystal layer 14.

Figure 4F:
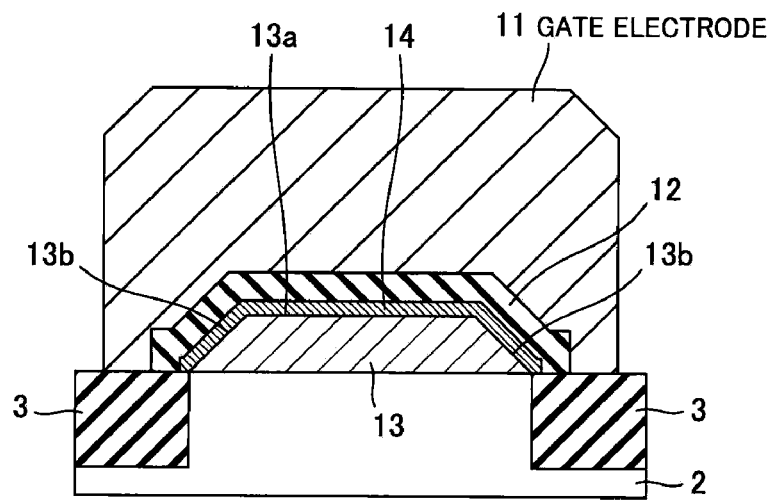

Next, as shown in FIG. 4F, after depositing a gate electrode material on the gate insulating film 12, the gate electrode 11 is formed by patterning the gate electrode material. Here, when the gate electrode 11 made of polycrystalline Si is formed, the gate electrode material is formed, e.g., about 100 nm in thickness by the CVD method under the temperature condition of 620° C. and the pressure condition of 1 Torr using $SiH_4$ gas, $N_2$ gas and $H_2$ gas. Meanwhile, when the gate electrode 11 made of a metal is formed, for example, a metal film made of TiN, TaC or TiAlN, etc, is formed as the gate electrode material by a sputtering method. The formed gate electrode material is patterned by using a lithography method, etc. Note that, when patterning the gate electrode material, it is preferable to process the gate insulating film 12, which is a lower layer, into a pattern similar to the gate electrode 11 and not to process the Si crystal layer 14 and the SiGe crystal layer 13 so as to be a structure shown in FIGS. 1, 3A and 3B.

After that, a conductivity type impurity is implanted into the gate electrode 11 by the ion implantation procedure, etc., and the conductivity type impurity is further implanted into the Si crystal layer 14, the SiGe crystal layer 13 and the semiconductor substrate 2, thereby forming the source/drain region 16. In the source/drain region 16, for example, after forming a shallow extension region using the offset spacer 15 as a mask, a gate sidewall is formed on outside of the offset spacer 15 and a deep region is formed using the gate sidewall as a mask. Here, the source/drain region 16 is formed in a shape such that a region of the SiGe crystal layer 13 surrounded by the source/drain regions 16 functions as a channel region. And then, a wiring, etc., is formed on the upper layer.

Effect of the First Embodiment

According to the first embodiment, it is possible to improve current drive power of a p-type transistor by using the SiGe crystal layer 13 as a channel region compared with the case of using the Si crystal. In particular, when a metal gate electrode is used, since a work function of a metal material is generally lower than that of the polycrystalline Si containing a p-type impurity and the threshold voltage is normally higher than a threshold voltage when a polycrystalline Si gate electrode is used, it is possible to decrease the threshold voltage by using the SiGe crystal layer 13 as a channel region.

Furthermore, since the oxidation reaction at the time of forming the gate insulating film 12 does not extends to the SiGe crystal layer 13 by forming the Si crystal layer 14 so that the thickness of a portion located on the first plane 13a is substantially same as that of a portion located on the second plane 13b, Ge is not substantially mixed into the gate insulating film 12. As a result, it is possible to suppress the degradation of a reliability of the gate insulating film 12.

In addition, it is possible to form the Si crystal layer 14 by selectively crystallizing only a portion of the amorphous Si film 4 located on the SiGe crystal layer 13 by the solid-phase epitaxial crystal growth method. As a result, it is possible to selectively remove only a non-crystallized portion of the amorphous Si film 4 and to remove a conductive material on the region except the p-type transistor region 10 which may cause reliability degradation.

Second Embodiment

The second embodiment is different from the first embodiment in that the semiconductor device 1 has an n-type transistor region 20 in addition to the p-type transistor region 10.
(Structure of Semiconductor Device)

Figure 5:
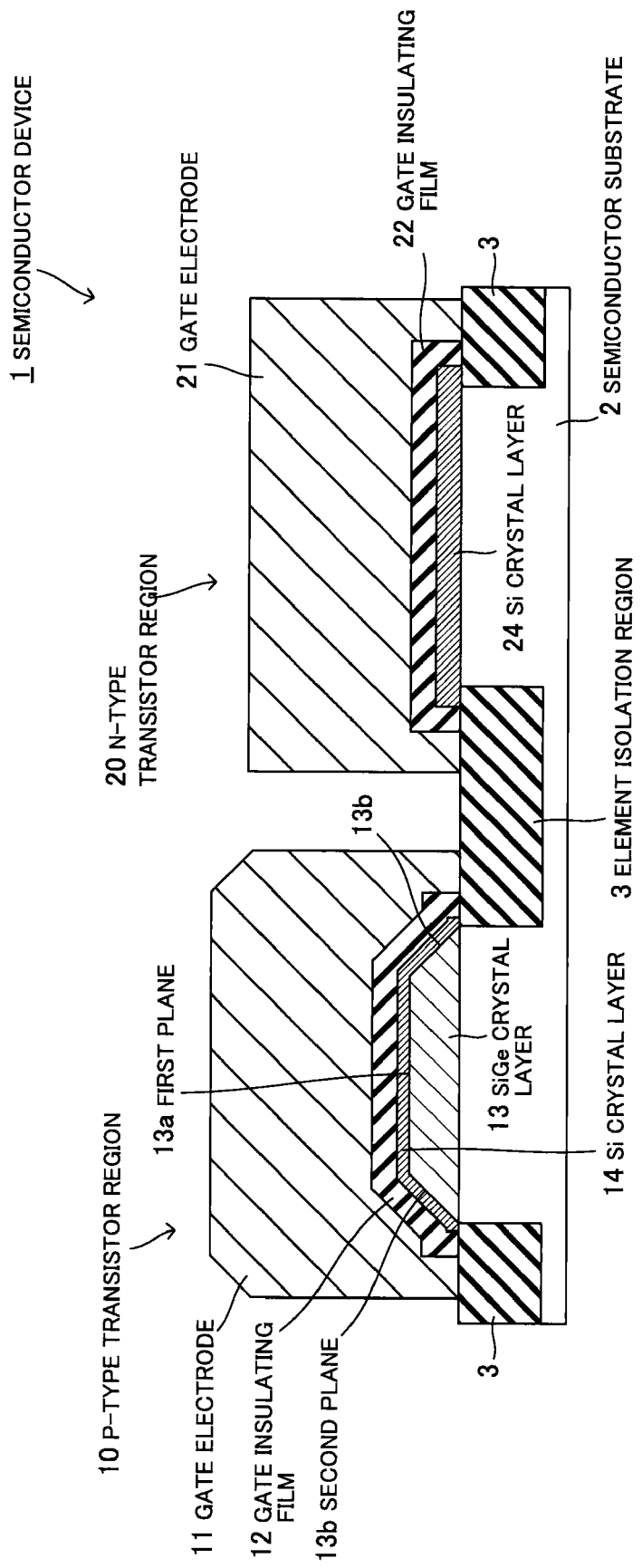
FIG. 5 is a cross sectional view showing a semiconductor device according to a second embodiment.

FIG. 5 is a cross sectional view showing a semiconductor device according to a second embodiment. A cross sections shown in FIG. 5 corresponds to that of the semiconductor device 1 according to the first embodiment shown in FIG. 2.

The semiconductor device 1 has a p-type transistor region 10 and an n-type transistor region 20. The p-type transistor region 10 and the n-type transistor region 20 are electrically separated from each other by the element isolation region 3. Note that, the configuration of the p-type transistor region 10 is same as the first embodiment.

The n-type transistor region 20 includes a Si crystal layer 24 formed on the semiconductor substrate 2, a gate electrode 21 formed on the Si crystal layer 24 via a gate insulating film 22, an offset spacer (not shown) formed on side faces of the gate electrode 21 and the gate insulating film 22, and source/drain regions (not shown) formed in the Si crystal layer 24 and the semiconductor substrate 2 on both side of a portion under the gate electrode 21.

The gate electrode 21 can be formed using the same material as the gate electrode 11. In addition, when the gate electrode 21 is made of a Si-based crystal, an n-type impurity such as As or P, etc., is contained.

The Si crystal layer 24 is made of a Si crystal formed by the solid-phase epitaxial crystal growth method using the upper surface of the semiconductor substrate 2 as a seed. Note that, a region of the Si crystal layer 24 sandwiched by the source/drain regions functions as a channel region. In addition, it is preferable that the Si crystal layer 24 covers the upper surface of the semiconductor substrate 2 in the n-type transistor region 20. Furthermore, a silicide layer may be formed on an upper surface of a portion of the Si crystal layer 24 located on both sides of the gate electrode 21.

The gate insulating film 22 is an insulating film formed by oxidizing a surface of a Si crystal formed by the solid-phase epitaxial crystal growth method using the upper surface of the semiconductor substrate 2 in the n-type transistor region 20 as a seed, and is made of an insulating material containing Si and O such as $SiO_2$ or SiON, etc.

The source/drain region (not shown) in the n-type transistor region 20 is formed by implanting an n-type impurity such as As or P, etc., into the Si crystal layer 24 and the semiconductor substrate 2 by an ion implantation procedure, etc.

An example of the processes for fabricating the semiconductor device 1 according to the present embodiment will be described hereinafter. Note that, since the process for fabricating the p-type transistor region 10 is same as the first embodiment, the explanation will be simplified.
(Fabrication of Semiconductor Device)

FIGS. 6A to 6G are cross sectional views showing processes for fabricating the semiconductor device according to the second embodiment.

Figure 6A:
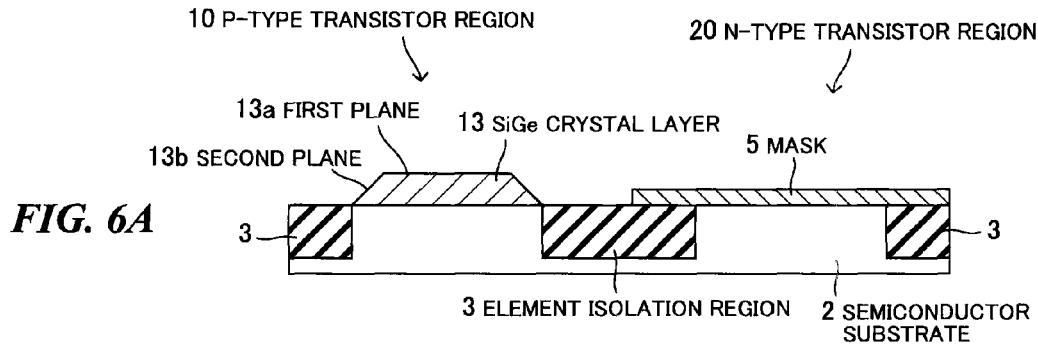
FIGS. 6A to 6G are cross sectional views showing processes for fabricating the semiconductor device according to the second embodiment.

Firstly, as shown in FIG. 6A, the element isolation regions 3 are formed in the semiconductor substrate 2, SiGe crystal is sequentially epitaxially grown using an upper surface of the semiconductor substrate 2 in the p-type transistor region 10 as a seed, thereby forming the SiGe crystal layer 13. Before epitaxially growing the SiGe crystal, a mask 5 such as a TEOS film, etc., is formed on the semiconductor substrate 2 in the n-type transistor region 20 for suppressing the growth of the SiGe crystal.

Figure 6B:
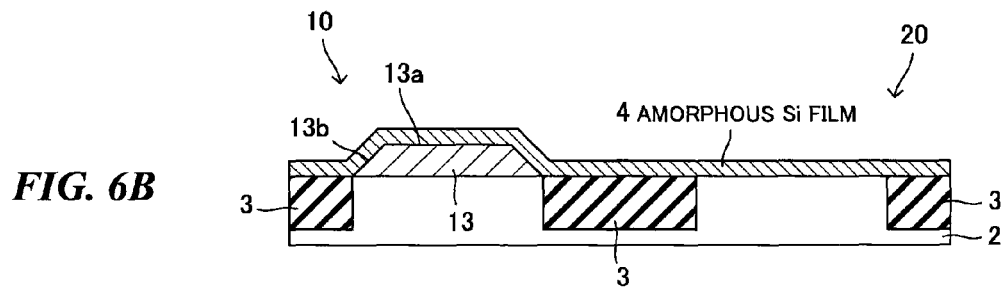

Next, as shown in FIG. 6B, after stripping the mask 5 using an HF solution, etc., the amorphous Si film 4 is formed on the SiGe crystal layer 13 in the p-type transistor region 10 as well as on the semiconductor substrate 2 in the n-type transistor region 20.

Figure 6C:
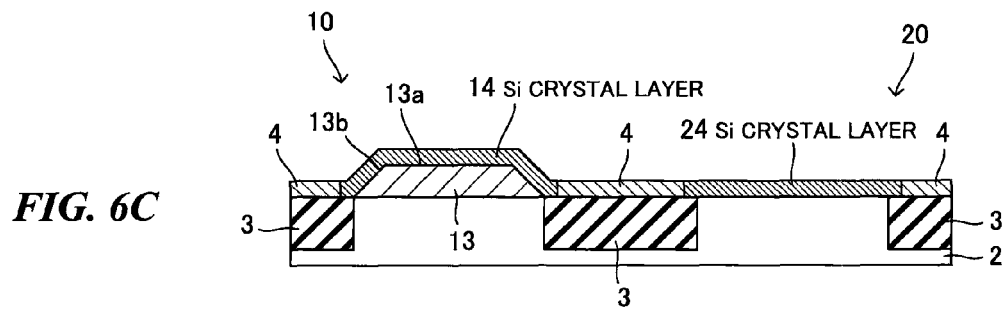

Next, as shown in FIG. 6C, the amorphous Si film 4 is crystallized by the solid-phase epitaxial crystal growth method using the first plane 13a and the second plane 13b of the SiGe crystal layer 13 in the p-type transistor region 10 and the upper surface of the semiconductor substrate 2 in the n-type transistor region 20 as a seed. As a result, a portion of the amorphous Si film 4 located adjacent to the interface with the SiGe crystal layer 13 in the p-type transistor region 10 becomes the Si crystal layer 14 and a portion of the amorphous Si film 4 located adjacent to the interface between the amorphous Si film 4 and the semiconductor substrate 2 in the n-type transistor region 20 becomes the Si crystal layer 24, and other portions (portions on the element isolation regions 3 in the figure) remain amorphous.

Note that, by annealing at 550-600° C., a process for forming the amorphous Si film 4 shown in FIG. 6B and a process for forming the Si crystal layers 14 and 24 shown in FIG. 6C can be continuously conducted in one process.

Figure 6D:
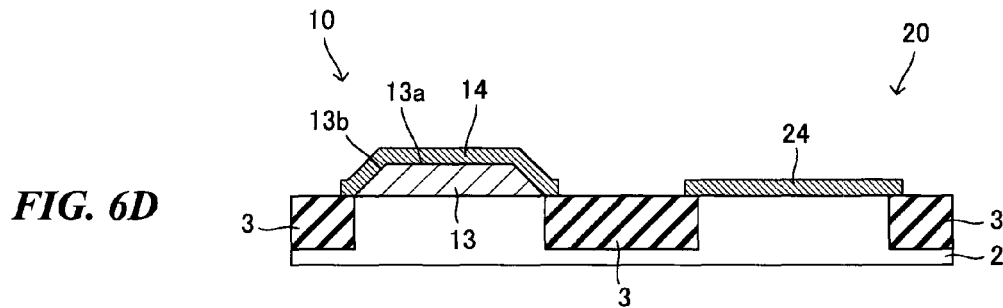

Next, as shown in FIG. 6D, the amorphous Si film 4 is selectively removed by etching. Consequently, only portions of the amorphous Si film 4 that becomes the Si crystal layers 14 and 24 by the crystallization are left. Note that, the amorphous Si film 4 may not be completely removed, and may be left as long as having a thickness to be completely oxidized in a posterior process for forming the gate insulating films 12 and 22.

In addition, it is preferable to conduct the processes from the formation of the SiGe crystal layer 13 shown in FIG. 6A until the removal of the amorphous Si film 4 shown in FIG. 6D in the same chamber.

Figure 6E:
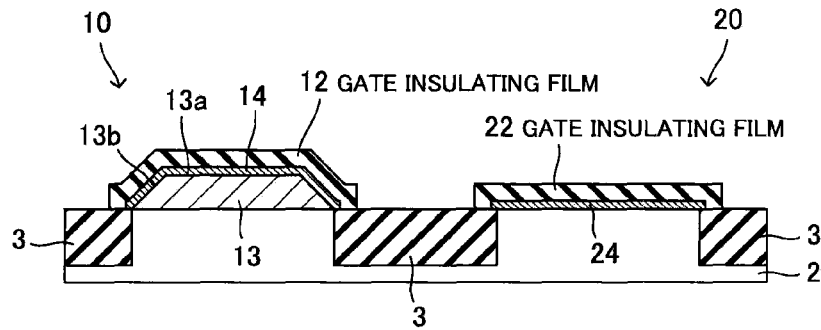

Next, as shown in FIG. 6E, the surfaces of the Si crystal layers 14 and 24 are oxidized by annealing, etc., in an $O_2$ atmosphere, thereby forming the gate insulating films 12 and 22.

Figure 6F:
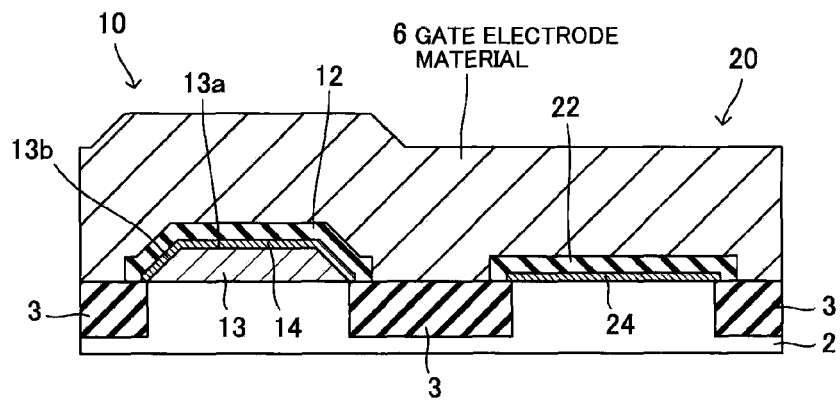

Next, as shown in FIG. 6F, a gate electrode material 6 is deposited on the gate insulating films 12 and 22 by the CVD method.

Figure 6G:
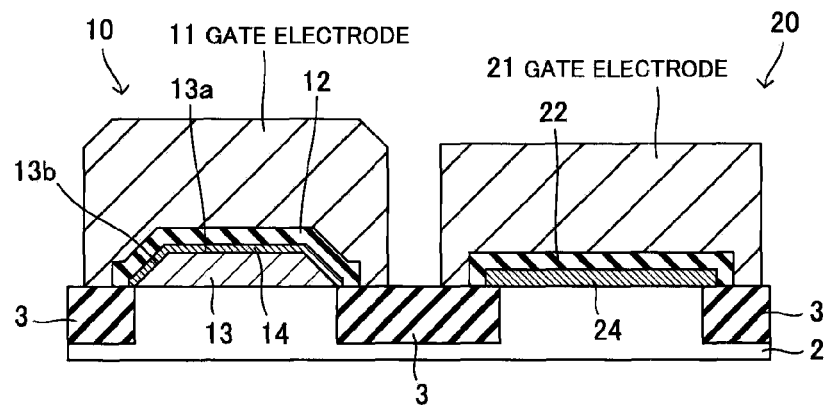

Next, as shown in FIG. 6G, the gate electrode material 6 is patterned and processed into the gate insulating films 12 and 22 by using the lithography method, etc. Note that, when patterning the gate electrode material, it is preferable to process the gate insulating films 12 and 24, which are lower layers of the gate electrodes 11 and 12, into patterns similar to the gate electrodes 11 and 12, and not to process the Si crystal layers 14 and 24 and the SiGe crystal layer 13.

After that, a conductivity type impurity is implanted into the gate electrodes 11 and 21 by the ion implantation procedure, etc., and the conductivity type impurity is further implanted into the Si crystal layer 14, the SiGe crystal layer 13 and the semiconductor substrate 2 in the p-type transistor region 10, thereby forming the source/drain region 16. And in the n-type transistor region 20, the conductivity type impurity is implanted into the Si crystal layer 24 and the semiconductor substrate 2, thereby forming the source/drain region (not shown).

Effect of the Second Embodiment

According to the second embodiment, a Si crystal layer used as a portion of a channel region is formed also in the n-type transistor region 20. In general, a high concentration impurity (of which conductivity type is opposite to that of the transistor) is implanted into the semiconductor substrate in order to suppress a short channel effect, however, there is a problem that carrier mobility deteriorates when the impurity concentration is high. Therefore, in the present embodiment, by implanting the high concentration impurity into the semiconductor substrate 2 and implanting a low concentration impurity into the Si crystal layer 24, it is possible to obtain both effects of the suppression of the short channel effect and the suppression of the carrier mobility deterioration.

In addition, it is possible to form the Si crystal layers 14 and 24 by selectively crystallizing only a portion of the amorphous Si film 4 located on the SiGe crystal layer 13 in the p-type transistor region 10 and a portion of the amorphous Si film 4 located on the semiconductor substrate 2 in the n-type transistor region 20 by the solid-phase epitaxial crystal growth method. As a result, it is possible to selectively remove only a non-crystallized portion of the amorphous Si film 4 and to remove a conductive member from the outside of the element region.

Third Embodiment

Figure 7:
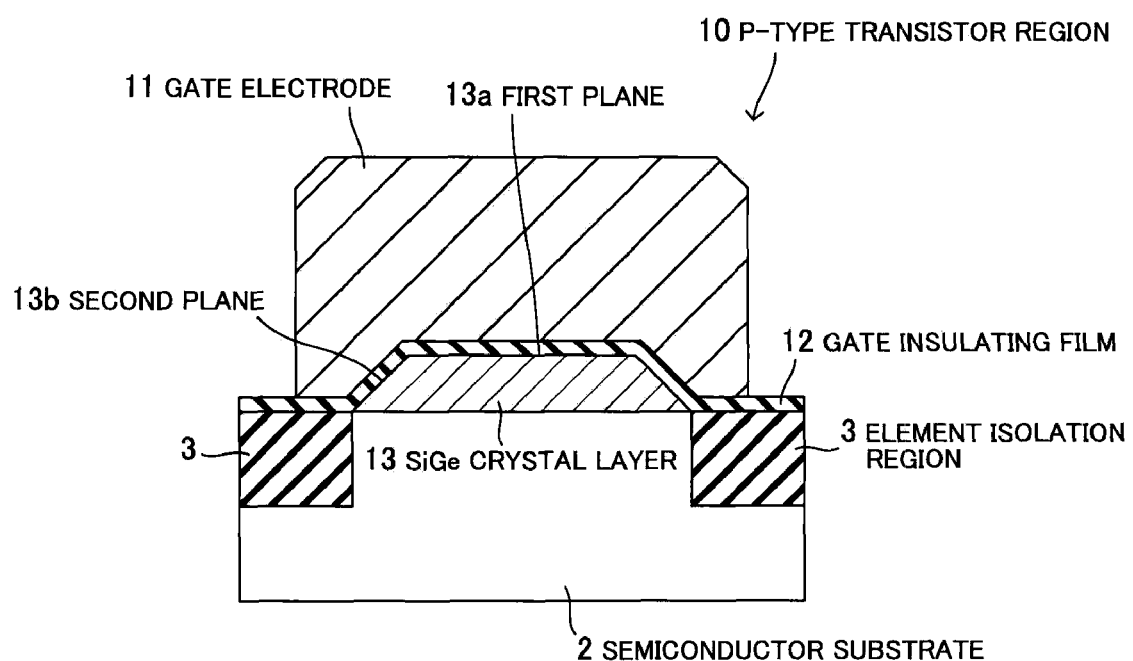
FIG. 7 is a cross sectional view showing a semiconductor device according to a third embodiment.

The third embodiment is different from the first embodiment in that the Si crystal layer is not formed.
(Structure of Semiconductor Device)
FIG. 7 is a cross sectional view showing a semiconductor device according to a third embodiment. A cross sections shown in FIG. 7 corresponds to that of the semiconductor device 1 according to the first embodiment shown in FIG. 2. The explanation will be omitted for the configuration same as the semiconductor device 1 of the first embodiment.

A semiconductor device 1 has a p-type transistor region 10 including a SiGe crystal layer 13 formed on a semiconductor substrate 2, a gate electrode 11 formed on the SiGe crystal layer 13 via a gate insulating film 12, an offset spacer (not shown) formed on side faces of the gate electrode 11 and the gate insulating film 12, and source/drain regions (not shown) formed in the SiGe crystal layer 13 and the semiconductor substrate 2 on both sides of a portion under the gate electrode 11. In addition, in the semiconductor device 1, the p-type transistor region 10 is electrically separated from other element regions by element isolation regions 3 formed in the semiconductor substrate 2.

The gate insulating film 12 is an insulating film formed by oxidizing the amorphous Si film 4 formed on the upper surface of the SiGe crystal layer 13, and is made of an insulating material containing Si and O such as $SiO_2$ or SiON, etc. Here, although Ge diffused from the inside of the SiGe crystal layer 13 may be mixed into the gate insulating film 12 via the Si crystal layer 14, since oxidation reaction at the time of forming the gate insulating film 12 does not extends to the SiGe crystal layer 13, Ge is not substantially contained in the gate insulating film 12.

An example of the processes for fabricating the semiconductor device 1 according to the present embodiment will be described hereinafter.
(Fabrication of Semiconductor Device)
FIGS. 8A to 8C are cross sectional views showing processes for fabricating the semiconductor device according to the third embodiment.

Firstly, the processes until the process, shown in FIG. 4A, for forming the SiGe crystal layer 13 are carried out in the same way as the first embodiment.

Figure 8A:
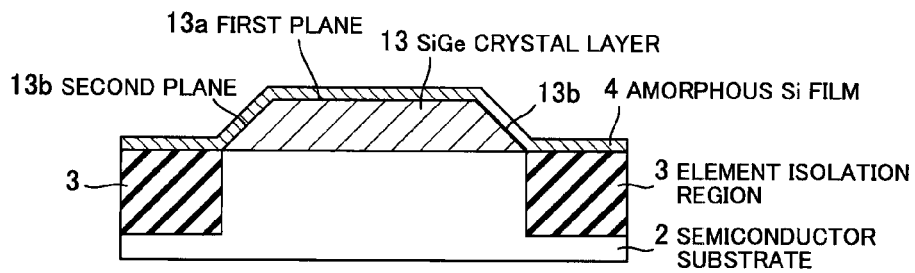
FIGS. 8A to 8C are cross sectional views showing processes for fabricating the semiconductor device according to the third embodiment.
Figure 8B:
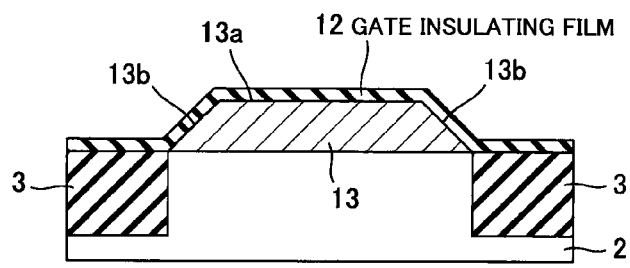
Figure 8C:
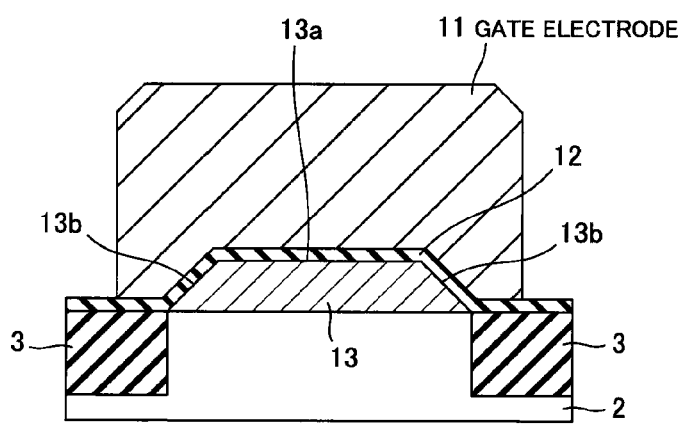

Next, as shown in FIG. 8A, the amorphous Si film 4 is formed on the SiGe crystal layer 13. The oxidation treatment is applied to the amorphous Si film 4 in order to form the gate insulating film 12 in a posterior process. It is preferable that the amorphous Si film 4 has a thickness such that the oxidation reaction at this time progresses to the interface between the amorphous Si film 4 and the SiGe crystal layer 13. This is because the oxidation reaction does not extent to a deep portion of the SiGe crystal layer 13 and the amorphous Si film 4 is almost entirely oxidized, which results in that the conductive material is not left out of the p-type transistor region 10.

For example, when the about 5 nm thick gate insulating film 12 is formed, the thickness of the amorphous Si film 4 is preferably about 2.3 nm since the oxidation reaction progresses to the depth of about 2.3 nm from the surface of the amorphous Si film 4.

Next, as shown in FIG. 8B, the Si crystal layer 14 is oxidized by annealing in an atmosphere containing $O_2$, thereby forming the gate insulating film 12. The oxidation reaction progresses from the surface of the amorphous Si film 4 to the proximity of an interface between the amorphous Si film 4 and the SiGe crystal layer 13. Alternatively, the gate insulating film 12 may be formed by plasma oxidizing the surface of the Si crystal layer 14.

Next, as shown in FIG. 8C, after depositing a gate electrode material on the gate insulating film 12, the gate electrode 11 is formed by patterning the gate electrode material.

After that, a conductivity type impurity is implanted into the gate electrode 11 by the ion implantation procedure, etc., and the conductivity type impurity is further implanted into the Si crystal layer 14 and the semiconductor substrate 2, thereby forming the source/drain region (not shown). And then, a wiring, etc., is formed on the upper layer.

Fourth Embodiment

The fourth embodiment is different from the third embodiment in that not all the amorphous Si film 4 is oxidized.

An example of the processes for fabricating the semiconductor device 1 according to the present embodiment will be described hereinafter.
(Fabrication of Semiconductor Device)
FIGS. 9A to 9D are cross sectional views showing processes for fabricating the semiconductor device according to a fourth embodiment.

Figure 9A:
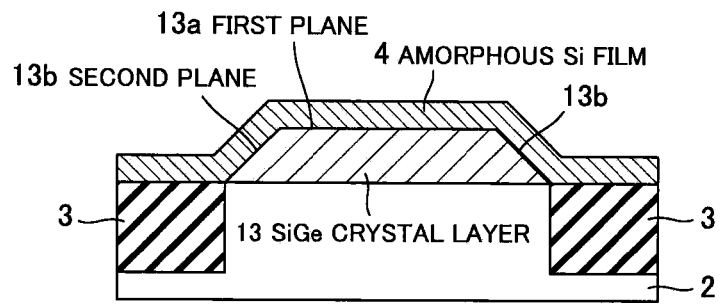
FIGS. 9A to 9D are cross sectional views showing processes for fabricating the semiconductor device according to a fourth embodiment.

Firstly, as shown in FIG. 9A, the processes until the process, shown in FIG. 4B, for forming the amorphous Si film 4 are carried out in the same way as the first embodiment.

Figure 9B:
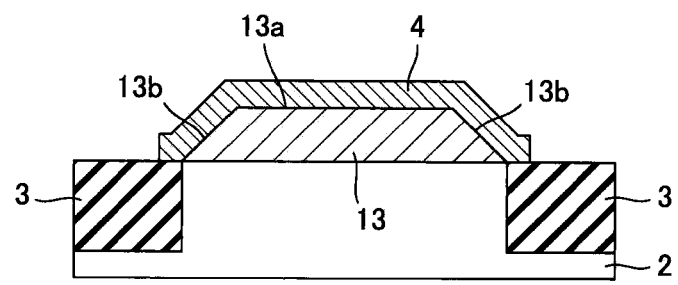

Next, as shown in FIG. 9B, a portion of the amorphous Si film 4 distant from the interface with the SiGe crystal layer 13 is removed by using the lithography method, etc.

Figure 9C:
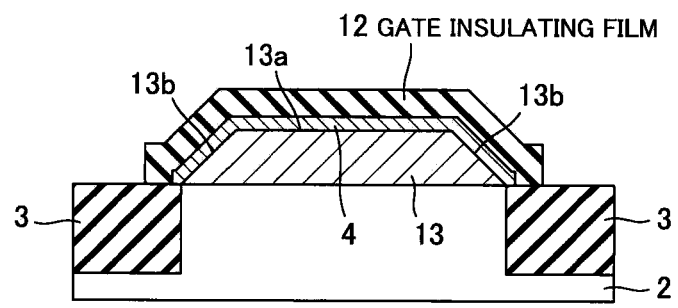

Next, as shown in FIG. 9C, the Si crystal layer 14 is oxidized by annealing in an atmosphere containing $O_2$, thereby forming the gate insulating film 12. At this time, the oxidation reaction may not progress from the surface of the amorphous Si film 4 to the proximity of an interface between the amorphous Si film 4 and the SiGe crystal layer 13, and the amorphous Si film 4 may be left without being completely oxidized. It is because a portion of the amorphous Si film 4 distant from the interface with the SiGe crystal layer 13 has been already removed in the process shown in FIG. 9B, and the conductive material is not left out of the p-type transistor region 10. Note that, the amorphous Si film 4 may be crystallized in this process. The amorphous Si film 4 is eventually crystallized through various heat treatments.

Figure 9D:
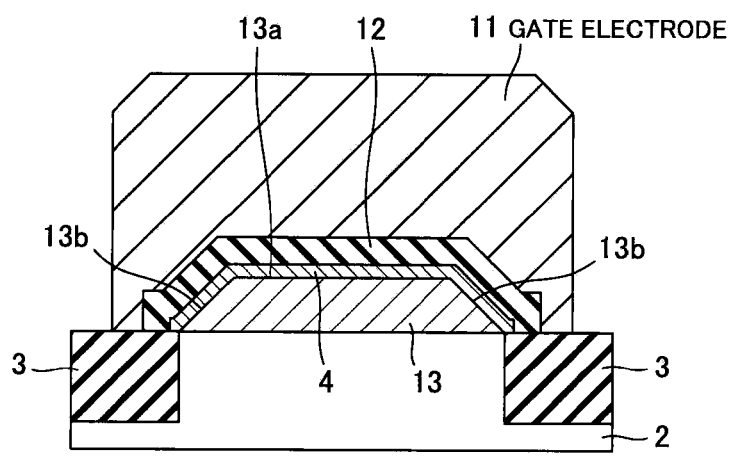

Next, as shown in FIG. 9D, after depositing a gate electrode material on the gate insulating film 12, the gate electrode 11 is formed by patterning the gate electrode material.

After that, a conductivity type impurity is implanted into the gate electrode 11 by the ion implantation procedure, etc., and the conductivity type impurity is further implanted into the Si crystal layer 14 and the semiconductor substrate 2, thereby forming the source/drain region (not shown). And then, a wiring, etc., is formed on the upper layer.

Other Embodiments

It should be noted that the embodiment is not intended to be limited to the above-mentioned first to fourth embodiments, and the various kinds of changes thereof can be implemented by those skilled in the art without departing from the gist of the invention. For example, as an insulating film, it is possible to use a high dielectric insulating film such as HfSiON, etc., laminated on the gate insulating film 12 of the above-mentioned each embodiment. As a result, it is possible to easily vary the thickness of the insulating film depending on each element. In addition, as a material of the high dielectric insulating film, it is possible to used a compound which contains, besides HfSiON, at least one of Hf, Zr, Ti, Al, La, Ta, Y and Mg, etc., and at least one of O and N. Note that, the high dielectric insulating film can be formed by using MOCVD (Metal Organic Chemical Vapor Deposition), ALD (Atomic Layer Deposition) or a sputtering method, etc.

In addition, after forming the gate insulating film 12, nitrogen may be added to the gate insulating film 12 by plasma in the above-mentioned each embodiment. As a result, it is possible to more effectively suppress the diffusion of Ge into the gate insulating film 12.

In addition, the constituent elements of the above-mentioned embodiments can be arbitrarily combined with each other without departing from the gist of the invention.

What is claimed is:

1. A method of fabricating a semiconductor device, comprising:
    forming a SiGe crystal layer on a semiconductor substrate, the SiGe crystal layer having a first plane and a second plane inclined with respect to the first plane;
    forming an amorphous Si film on the SiGe crystal layer;
    crystallizing a portion located adjacent to the first and second planes of the amorphous Si film by applying heat treatment using the first and second planes of the SiGe crystal layer as a seed, thereby forming a Si crystal layer;
    selectively removing or thinning a portion of the amorphous Si film that is not crystallized by the heat treatment;
    applying oxidation treatment to a surface of the Si crystal layer, thereby forming a gate insulating film on the surface of the Si crystal layer; and
    forming a gate electrode on the gate insulating film.

2. A method of fabricating a semiconductor device according to claim 1, wherein
    the semiconductor substrate comprises p-type and n-type transistor regions;
    the SiGe crystal layer is selectively formed on the semiconductor substrate in the p-type transistor region;
    the amorphous Si film is formed on the SiGe crystal layer in the p-type transistor region and on the semiconductor substrate in the n-type transistor region;
    portions of the amorphous Si film located adjacent to the first and second planes in the p-type transistor region and adjacent to an upper surface of the semiconductor substrate in the n-type transistor region are crystallized by the heat treatment using the first and second planes of the SiGe crystal layer in the p-type transistor region and the upper surface of the semiconductor substrate in the n-type transistor region as a seed, thereby forming the Si crystal layer and another crystal layer in the p-type and n-type transistor regions;
    a portion of the amorphous Si film that is not crystallized by the heat treatment is selectively removed or thinned;
    the gate insulating film and another gate insulating film are each formed on surfaces of the Si crystal layer and the other Si crystal by applying the oxidation treatment to the surfaces of the Si crystal layer and the other Si crystal; and
    the gate electrode and the other electrode are each formed on the gate insulating film and the other gate insulating film.

3. A method of fabricating a semiconductor device according to claim 1, wherein
    a principal surface of the semiconductor substrate is a (100) plane;
    the first plane is a (100) plane; and
    the second plane is a (111) plane.

4. A method of fabricating a semiconductor device according to claim 1, wherein a silicide layer is formed on a portion of the Si crystal layer located on both sides of the gate electrode.

5. A method of fabricating a semiconductor device according to claim 4, wherein the silicide layer comprises Ni silicide.

6. A method of fabricating a semiconductor device according to claim 1, wherein a Ge concentration of the SiGe crystal layer is about 3-33 at. %.

7. A method of fabricating a semiconductor device according to claim 1, wherein a thickness of the SiGe crystal layer is about 5-30 nm.

8. A method of fabricating a semiconductor device according to claim 1, wherein the amorphous Si film is formed thicker than a progressing depth of an oxidation reaction that is generated in the Si crystal layer by the oxidation treatment.

9. A method of fabricating a semiconductor device according to claim 1, wherein steps from a formation of SiGe crystal layer to a selective removal or thinning of the portion of the amorphous Si film not crystallized by the heat treatment are conducted in the same chamber.

10. A method of fabricating a semiconductor device according to claim 1, wherein source/drain regions are formed in the Si crystal layer, the SiGe crystal layer and the semiconductor substrate after forming the gate electrode, the source/drain region having a shape such that a region of the SiGe crystal layer sandwiched by the source/drain regions functions as a channel region.

11. A method of fabricating a semiconductor device, comprising:

forming a SiGe crystal layer on a semiconductor substrate, the SiGe crystal layer having a first plane and a second plane inclined with respect to the first plane;

forming an amorphous Si film on the SiGe crystal layer;

forming a gate insulating film by applying oxidation treatment to a surface of the amorphous Si film; and forming a gate electrode on the gate insulating film, wherein the gate insulating film is formed by applying the oxidation treatment up to an intermediate portion from the surface of the amorephous Si film; and a non-oxidized region of the amorephous Si film is crystallized during or after forming the gate insulating film.

12. A method of fabricating a semiconductor device according to claim 11, wherein a principal surface of the semiconductor substrate is a (100) plane;

the first plane is a (100) plane; and the second plane is a (111) plane.

* * * * *